United States Patent
Osama et al.

(10) Patent No.: US 6,480,421 B2
(45) Date of Patent: Nov. 12, 2002

(54) CIRCUIT FOR READING NON-VOLATILE MEMORIES

(75) Inventors: Khouri Osama, Milan (IT); Stefano Gregori, Torre D'Isola (IT); Andrea Pierin, Graffignana (IT); Rino Micheloni, Turate (IT); Sergio Coronini, Dietikon (CH); Guido Torelli, Sant'Alessio con Vialone-Lardirago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/003,474

(22) Filed: Oct. 25, 2001

(65) Prior Publication Data

US 2002/0099988 A1 Jul. 25, 2002

(51) Int. Cl.[7] .............................................. G11C 16/06
(52) U.S. Cl. .............................. 365/185.21; 365/185.2; 365/189.01; 365/205; 365/196; 365/189.09
(58) Field of Search ....................... 365/189.01, 189.09, 365/196, 205, 185.2, 185.21, 230.01

(56) References Cited

U.S. PATENT DOCUMENTS

| | | | | |
|---|---|---|---|---|
| 5,297,093 A | * | 3/1994 | Coffman ..................... 365/208 |
| 5,493,533 A | * | 2/1996 | Lambrache .................. 365/210 |
| 5,566,110 A | * | 10/1996 | Soenen .................. 365/185.07 |
| 5,654,918 A | * | 8/1997 | Hammick ................ 365/185.2 |
| 5,864,513 A | * | 1/1999 | Pascucci ..................... 365/210 |
| 5,910,914 A | * | 6/1999 | Wang .................... 365/185.21 |
| 5,929,658 A | * | 7/1999 | Cheung et al. ............... 327/53 |
| 6,066,976 A | * | 5/2000 | Cho .......................... 327/350 |
| 6,191,989 B1 | * | 2/2001 | Luk et al. ................... 365/207 |
| 6,288,960 B1 | * | 9/2001 | Conte et al. ................ 365/205 |
| 6,339,318 B1 | * | 1/2002 | Tanaka ....................... 323/313 |
| 6,400,607 B1 | * | 6/2002 | Pasotti .................. 365/185.21 |

* cited by examiner

*Primary Examiner*—Viet Q. Nguyen
(74) *Attorney, Agent, or Firm*—Lisa K. Jorgenson; Allen, Dyer, Doppelt, Milbrath & Gilchrist, P.A.

(57) ABSTRACT

A circuit for reading a non-volatile memory cell has an output terminal for providing an output current, and a control terminal for receiving a voltage for controlling the output current. The reading circuit includes a feedback circuit which can be connected electrically to the output terminal and to the control terminal to generate the control voltage from a reference signal and from the output current. The feedback circuit also includes a current-amplification circuit having a first terminal for receiving a current-error signal derived from the reference signal and from the output current, and a second terminal for supplying an amplified current.

36 Claims, 2 Drawing Sheets

US 6,480,421 B2

CIRCUIT FOR READING NON-VOLATILE MEMORIES

FIELD OF THE INVENTION

The present invention relates to memory devices, and in particular, to a reading circuit of the voltage-sensing type for reading non-volatile memory cells in a memory device.

BACKGROUND OF THE INVENTION

The storage of a data in digital form in a non-volatile memory cell such as, for example, a flash electrically erasable programmable read-only memory (EEPROM) cell takes place by suitable programming of the threshold voltage of the cell. The need to use memory devices with ever higher capacities has made multilevel memories particularly advantageous. Theoretically, in a multilevel memory, the threshold voltage of a cell of the memory can be programmed not merely to one of two possible levels (as is the case for two-level cells) but to one of $2^n-1$ levels, enabling n bits to be stored in a single cell.

Two different techniques are known for reading the data stored in a memory cell. According to one of these techniques, known as current sensing, the reading is performed while the voltages applied to the drain, to the source, and to the gate of the memory cell to be read are kept constant and at a suitable value. In similar conditions of biasing, the cell addressed will therefore absorb a drain current which depends on its programming state.

In contrast, the other reading technique, which is known as voltage sensing, provides for the reading to be performed while the drain current absorbed by the cell addressed is kept constant and the biasing conditions at the drain and source terminals are fixed. In particular, voltage sensing takes place by acting on the gate voltage to force the memory cell to absorb a predetermined current. The threshold voltage programmed in the cell, which is unequivocally correlated with the gate voltage, can be determined by evaluating the gate voltage which brings the cell to absorb this current in steady-state conditions, and thus deriving the data stored in the cell. In one of its possible forms, this reading technique requires a control circuit which regulates the gate voltage applied to the cell in order for the cell to absorb the predetermined current.

U.S. Pat. No. 6,034,888 describes a voltage sensing reading circuit in which a negative feedback circuit is used. The feedback circuit comprises an operational amplifier which receives the drain voltage of the memory cell to be read at a non-inverting input, and a biasing voltage at an inverting input. This operational amplifier outputs the voltage to be applied to the gate terminal of the cell. The times required to reach a steady state, which are indicated in the patent, may be 1 μs or 500 ns, according to the particular circuit configuration. Moreover, in this patent, it is pointed out that the node (indicated by the numeral 16) of the feedback circuit described with reference to FIG. 1, therein which connects the non-inverting input of the operational amplifier to the drain terminal of the memory cell, may cause instability in the reading circuit.

The instability of the reading circuit formed in accordance with this patent is attributable to the presence of high-impedance nodes to which low-frequency poles of the transfer function of the feedback circuit correspond. This instability represents a considerable disadvantage, since it necessitates the use of additional compensation circuits which, as well as making the circuit configuration complex, brings about an increase in the reading times. That is, there is an increase in the time taken to reach the steady state in which the data programmed in the cell is evaluated.

Moreover, it is pointed out that the above mentioned patent does not address problems connected with power consumption by the circuit.

In the construction of integrated devices in semiconductor chips, such as memories, there is a tendency to reduce the supply voltage by bringing it down, for example, to values of 3 V or 1.8 V. This tendency conflicts with the need, which is characteristic of reading circuits in the multilevel context, to supply the memory cell to be read with a gate voltage greater than that of the supply in order to interact correctly with the cell.

This need is thus pressing for multilevel cells, since a widening of the range of voltages applicable to the gate terminal of the memory cell renders the discrimination of the threshold programmed among a number of possible values, which is required to be as high as possible, less critical. In order to supply sufficiently high voltages, conventional reading circuits make use of integrated positive voltage-booster devices.

It is pointed out that, in order to read memories with a large number of cells, the area in the semiconductor chip intended for the positive voltage-boosters and the power absorbed thereby, may become considerable. It is therefore essential to provide reading circuits for which the dimensions and/or the number of positive voltage-boosters used is limited.

SUMMARY OF THE INVENTION

In view of the foregoing background, an object of the present invention is to provide a reading circuit for reading memory cells which does not have the disadvantages indicated above with reference to conventional reading circuits.

This and other objects, advantages and features are achieved by a reading circuit for reading a non-volatile memory cell having an output terminal for an output current, and a control terminal for receiving a voltage for controlling the output current. The reading circuit comprises a feedback circuit which can be connected electrically to the output terminal and to the control terminal to generate the control voltage from a reference signal and from the output current.

The feedback circuit comprises current-amplification means having a first terminal for receiving a current error signal derived from the reference signal and from the output current, and a second terminal for supplying an amplified current.

BRIEF DESCRIPTION OF THE DRAWINGS

The characteristics and advantages of the present invention will become clear from the detailed description of a preferred embodiment thereof, provided purely by way of a non-limiting example and given with the aid of the appended drawings, in which.

DETAILED DESCRIPTION OF THE PREFERRED EMBODIMENTS

Figure 1:
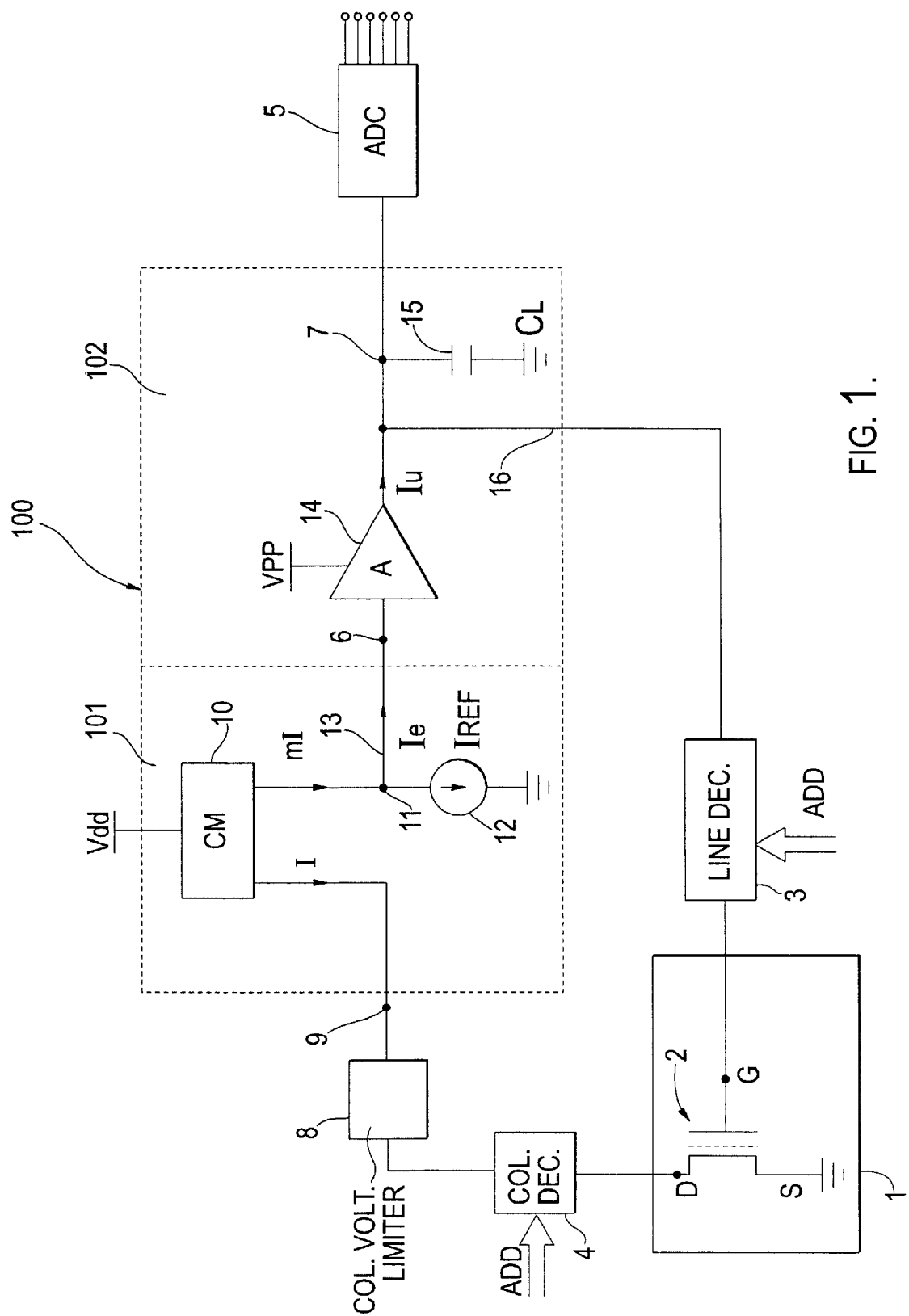
FIG. 1 is a block diagram of a reading circuit for reading memory cells in a memory device according to the present invention.

FIG. 1 shows, by functional blocks, a particular circuit for reading a matrix of memory cells 1. The reading circuit comprises a column decoder 4, a column voltage limiter or bitline limiter 8, a feedback circuit 100, an analog/digital converter 5, and a line decoder 3.

The memory matrix 1 comprises a plurality of non-volatile memory cells of which a single memory cell 2 is shown in FIG. 1. The cell 2 is, for example, of the two-level or multilevel flash EEPROM type. As is known, a cell of this type uses a floating gate metal oxide semiconductor field-effect transistor (MOSFET) for which the storage of data takes place by suitable programming of the threshold voltage $V_{th}$.

In greater detail, the memory cell 2 has a source terminal S connected to ground, a drain terminal D connected to the column decoder 4, and a gate terminal G connected to the line decoder 3. The column decoder 4 and the line decoder 3, which are formed for example, in a conventional manner, enable a column and a line, respectively, of the memory matrix 1 to be selected on the basis of a suitable address signal ADD, so as to address a memory cell.

In the embodiment of FIG. 1, the column decoder 4 enables the drain terminal D of the memory cell 2 to be connected, by the bitline limiter 8, to an input terminal 9 of the feedback circuit 100. The line decoder 3 enables the gate terminal G to be connected, by a conductive branch 16, to an output node or terminal 7 of the feedback circuit 100. The bitline limiter 8 enables the voltage of the drain terminal D of the memory cell 2 selected by the decoders 3 and 4 to be kept at a suitable value. This bitline limiter 8 may be formed in a conventional manner.

The circuit comprising the memory cell 2 and the reading circuit of FIG. 1 is a voltage sensing circuit with negative feedback. The feedback circuit 100 supplies to the gate terminal G of the memory cell 2 a control or regulating voltage to force the cell to absorb a current of predetermined value. The reading circuit of FIG. 1 and the memory matrix 1 are preferably formed in a single integrated circuit on a chip of semiconductor material.

The feedback circuit 100 comprises a low-voltage stage 101 and a high-voltage stage 102. The low-voltage stage 101 includes a current mirror 10 formed, for example, by P-type MOSFETs and has an input branch connected to the input terminal 9 and an output branch connected to a node 11. The current mirror 10 enables a current mI which is a multiple, by a factor m, of the current I present at the input terminal 9, to be supplied to the node 11. The node 11 is also connected to a current generator 12 which can generate reference current $_{REF}$. The current mirror 10 is supplied by a voltage $V_{dd}$ such as, for example, the standard supply voltage supplied by an external supply to the chip containing the circuit of FIG. 1 and the memory matrix 1. For example, this supply voltage may be 5 V, 3 V or 1.8 V. The node 11 has a conductive branch 13 for connecting the low-voltage stage 101 to the high-voltage stage 102.

The high-voltage stage 102 includes current-amplification means comprising, for example, a current amplifier 14 provided with an input terminal 6 connected to the conductive branch 13, and with the output terminal 7. In particular, this current amplifier 14 is of the inverting type. That is, it supplies at the output terminal 7 a current having an amplitude equal to the amplitude of the current present at the input terminal 6, multiplied by a suitable gain factor A and has a phase which is opposite the phase of the current present at the input terminal 6.

The current amplifier 14 preferably has an input stage with suitably low impedance so that the pole which this input stage introduces in the transfer function of the reading circuit of FIG. 1 is a non-dominant pole disposed sufficiently out of band so as not to critically affect the stability of the circuit with feedback.

Typically, the current amplifier 14 is supplied by a voltage $V_{pp}$ greater than the supply voltage $V_{dd}$. The voltage $V_{pp}$ may be obtained from the voltage $V_{dd}$ by positive voltage-boosters or charge-pump circuits of conventional type and formed by integration. The output node 7 of the amplifier 14 is connected to the gate terminal G of the memory cell 2.

This output node 7 is also connected to a compensation capacitor 15 with a capacitance $C_L$ which in turn is connected between the node 7 and ground. Typically, this capacitor 15 has a capacitance $C_L$ suitably greater than the equivalent stray capacitance due to other components connected to the output node 7, such as the gate G of the cell 2, the line decoder 3, and the conductive branch 16. In selecting the dimensions of the circuit of FIG. 1, it is thus possible to ignore the capacitive contributions of these elements, which cannot be determined precisely beforehand, and to make reference to the capacitance $C_L$ of predetermined value. For example, the capacitor 15 may have a capacitance of a few pF.

The capacitor 15 is such that it can be charged and discharged by the output current of the amplifier 14 to generate the control voltage to be applied to the gate terminal G. The current amplifier 14 is preferably such as to have an output stage having an impedance of suitably high value so that, together with a suitable value of the capacitance $C_L$ of the capacitor 15, the pole at the output node 7 is a dominant pole of the transfer function of the reading circuit of FIG. 1. In this case, the feedback circuit shown in FIG. 1 has a transfer function which can be approximated to a single-pole function and the circuit is thus unconditionally stable.

The gate terminal G is connected to the analog/digital converter 5, of conventional type, which enables the analog voltage generated at the output node 7 to be converted into a set or word of n bits corresponding to the data stored in the memory cell 2.

The operation of the feedback circuit 100 for supplying to the gate terminal G of the memory 2 the control voltage $V_G$ to cause the current present at the drain terminal D of the cell to adopt a predetermined value $I_{0cell}$ will now be described. The gate control voltage $V_{GR}$ (evaluated in the steady state) for which the absorption of the current $I_{0cell}$ is obtained is correlated unequivocally with the threshold voltage $V_{TH}$ programmed in the memory cell 2 in accordance with the equation:

$$V_{GR}=V_{TH}+V_0V \qquad (1)$$

in which the voltage $V_{OV}$ is the overdrive voltage necessary for the current $I_{0cell}$ to flow in the memory cell 2.

In an initial stage, the gate voltage of the memory cell 2 addressed by the decoders 3 and 4 is set at an initial value $V_0$ which, advantageously, is selected within a range $\Delta V_{th}$ of variation of the threshold voltages. For example, this range $\Delta V_{th}$ extends between 2V and 6.5 V.

At the initial voltage $V_0$, the memory cell 2 absorbs a current $I_{cell}$ (which may even be zero) which is multiplied by the factor m defined above by the current mirror 10 and is then supplied to the node 11. With reference to the direction of the current flow indicated in FIG. 1, in the branch 13, there is a current $I_e$ equal to the difference between the current $mI_{cell}$ output by the current mirror 10 and the current $I_{REF}$ generated by the current generator 12: $I_e=mI_{cell}-I_{REF}$. The node 11 has the function of a comparison node between the current derived from the cell 2 and multiplied by the current mirror 10 and the reference current $I_{REF}$, while the current $I_e$ represents an error signal for the feedback circuit 100.

A situation in which the current $mI_{cell}$ is less than the current $I_{REF}$ will now be considered. This corresponds to the situation in which the current $I_{cell}$ is less than the current $I_{0cell}$ defined above. In this condition, the overdrive voltage $V_{OV}$ of the memory cell 2 is less than the value indicated by equation (1) and therefore, in order to set the current $I_{0cell}$ in the memory cell 2, it is necessary to raise the voltage $V_G$ of the gate terminal G. Upon the assumption mentioned above, the current $I_e$ input to the current amplifier 14 has a negative sign and the amplifier 14 supplies to the output terminal 7 a current $I_u$ of a sign and amplitude such as to charge the capacitor 15, bringing the gate terminal G to a voltage value $V_G$ greater than the initial value $V_0$.

It is assumed that, at this voltage value $V_G'$, the current $mI_{cell}$ becomes greater than the reference current $I_{REF}$. In this case, an increase takes place in the current $I_e$ relative to the value adopted previously, causing the current amplifier 14 to output a current of a sign and amplitude such as at least partially to discharge the capacitor 15, and consequently to reduce the voltage of the gate terminal G of the memory cell 2. This control of the voltage $V_G$ of the gate terminal G of the memory cell 2 continues until an equilibrium condition is reached, in which the current $I_e$ input to the current amplifier 14 is zero.

In the embodiment described, the current amplifier 14 is advantageously supplied by a voltage $V_{pp}$ greater than the supply voltage $V_{dd}$ since the control voltage to be applied to the gate terminal G of the memory cell 2 is normally greater than the voltage $V_{dd}$ supplied by the supply alone. The reading of the memory cell 2 is completed by converting the voltage $V_{GR}$ applied to the gate terminal G of the cell into the word of n bits corresponding to the data programmed in the cell by the analog/digital converter 5.

By introducing a current multiplication factor, the current mirror 10 enables a comparison to be performed in the node 11 between currents of relatively high value so as to minimize the weight of any inaccuracies in the reference current $I_{REF}$. This enables the reading circuit described above to operate with high performance in terms of accuracy, permitting correct reading of multilevel memory cells and, in particular, cells having more than eight possible programming levels.

Moreover, the use of the current mirror 10 limits the current absorbed by the cell (for example, to less than 15–20 $\mu A$) and hence the stress to which the cell is subjected, and lengthening the average life of the data stored. Furthermore, as stated above, the current mirror 10 can be supplied by the supply voltage $V_{dd}$ and does not therefore require the use of positive voltage-booster devices.

The use of the high voltages in the feedback circuit 100 is optimized, keeping performance high in terms of accuracy. In fact, in the reading circuit 100, only those stages for which the supply voltage $V_{dd}$ may be insufficient, as may be the case, for example, for the stage 102 comprising the current amplifier 14, are supplied by the voltage $V_{pp}$ generated by one or more positive voltage-boosters. A limited number of positive voltage-boosters can therefore be used for the circuit of FIG. 1, or positive voltage-boosters of small dimensions may be used, reducing power consumption and the area occupied by the circuit on a semiconductor chip. In particular, with the use of multilevel memory cells, the saving in area avoids canceling out the gain in area achieved by the multilevel technology.

Moreover, with regard to stability, the behavior of the feedback circuit 100 is improved in comparison with that of known reading circuits. In fact, as sated above, the input stage of the current amplifier 14 can have dimensions such that they do not give rise to instability. In particular, the input stage and the output stage of the current amplifier 14 may have dimensions such as to render the circuit with feedback of FIG. 1 unconditionally stable.

The greater stability which can be achieved by the feedback circuit 100 avoids the use of compensation circuits which cause an increase in reading times, and thus has the advantage of enabling the reading circuit to operate at fast speeds. On the basis of the foregoing description, a person skilled in the art can easily design particular circuit configurations which implement the functions of the blocks shown in FIG. 1.

Figure 2:
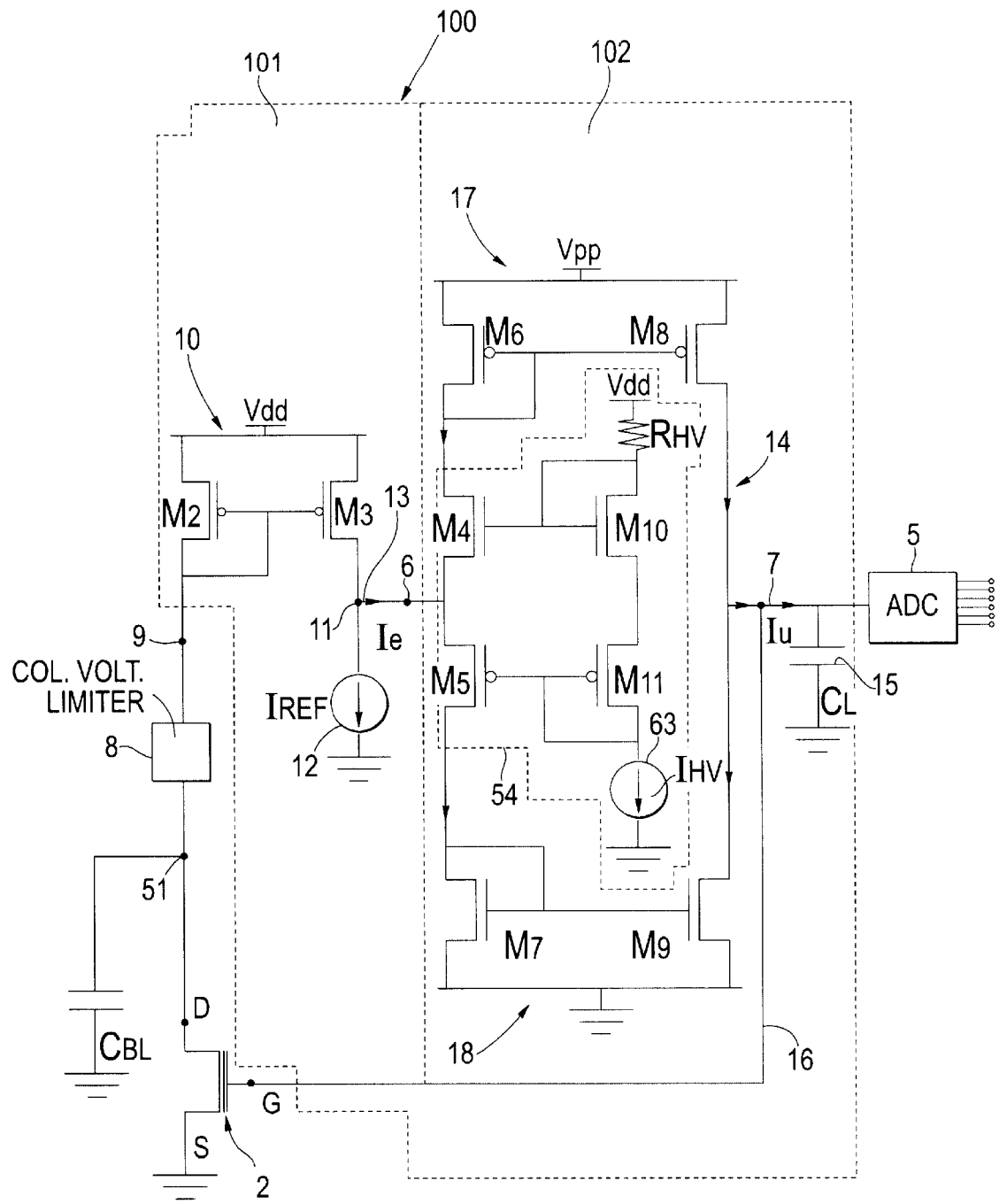
FIG. 2 is a more detailed schematic diagram of the reading circuit illustrated in FIG. 1.

For completeness of description, some possible circuit configurations which may be used for these functional blocks are shown in FIG. 2. For simplicity of representation, FIG. 2 does not show the line decoder 3, the column decoder 4 or the memory matrix 1, for which capacitors and resistors of suitable capacitance and resistance may be substituted.

The memory cell 2 has its drain terminal connected to a first terminal or node 51 of the bitline limiter 8. Moreover, to take account of the capacitive contribution of the column decoder 4, of the capacitance of the drain terminal D of the memory cell 2, and of the capacitances of the drain terminals of other memory cells of the column of the matrix 1 to which the cell 2 belongs, a capacitor of capacitance $C_{BL}$ has been introduced, disposed between the node 51 and ground.

The bitline limiter 8, the operation of which is known to a person skilled in the art, is advantageously supplied with low voltage, that is, with the standard supply voltage $V_{dd}$. It is stressed that the bitline limiter 8 enables the capacitive weight of the first terminal 51 connected to the drain terminal D of the memory cell 2 to be ignored. In fact, the bitline limiter 8 keeps the voltage of the first terminal 51 substantially constant by causing that terminal to appear as a ground, and hence to have a low resistance for a dynamic signal. This means that the bitline limiter 8 is not significant for the stability of the circuit of FIG. 1.

A second terminal of the bitline limiter 8 is connected to the input branch of the current mirror 10 which comprises, in the embodiment shown, a PMOS transistor $M_2$ having a drain terminal connected to its own gate terminal. The current mirror 10 also comprises a PMOS transistor $M_3$ having a gate terminal connected to the gate terminal of the transistor $M_2$. The transistors $M_2$ and $M_3$ are supplied by the supply voltage $V_{dd}$ at their source terminals.

As is clear to a person skilled in the art, during the operation of the current mirror 10, at a drain of the transistor $M_3$, there is a current equal to the current present at the drain terminal of the transistor $M_2$, multiplied by the above mentioned multiplication factor m, which depends on the aspect ratios of the transistors $M_2$ and $M_3$.

The transistor $M_3$ of the current mirror 10 has its drain terminal connected to the node 11 which enables the current output by the current mirror 10 to be compared with the reference current $I_{REF}$ supplied by the current generator 12. This node 11 is connected to the input terminal 6 of the current amplifier 14 which comprises an input stage 54 and an output stage including a first current mirror 17 and a second current mirror 18.

The input stage 54 includes an NMOS transistor $M_4$ and a PMOS transistor $M_5$ which are biased in a common-gate arrangement and have respective source terminals connected to the input terminal 6 in order to receive the current $I_e$. The transistor $M_4$ has a drain terminal connected to the first current mirror 17, which includes two PMOS transistors, and the transistor $M_5$ has a drain terminal connected to the second current mirror 18, which includes two NMOS transistors. Moreover, the transistors $M_4$ and $M_5$ have gate terminals connected, respectively, to a biasing stage. This stage may have dimensions such that the input stage 54 operates in Class AB.

For example, the biasing stage includes a first NMOS biasing transistor $M_{10}$ having a drain terminal connected, by a resistor of resistance $R_{HV}$, to a terminal to which the voltage $V_{pp}$ obtained by suitably amplifying the supply voltage $V_{dd}$ is supplied. The first biasing transistor $M_{10}$ has a source terminal connected to a source terminal of a second biasing transistor PMOS $M_{11}$, having a drain terminal connected to a generator 63 of a current $I_{HV}$ and then to ground. The first and the second biasing transistors $M_{10}$, $M_{11}$ are connected as diodes, that is, they have their respective gate terminals connected to their drain terminals.

Moreover, the gate terminals of the two biasing transistors $M_{10}$ and $M_{11}$ are connected to the gate terminals of the transistors $M_4$ and $M_5$, respectively, so as to supply a suitable biasing voltage thereto. The dimensions of the biasing stage enables the static current which the amplifier 14 will absorb in the steady state, that is, in the presence of a zero signal, to be set by the positive voltage-boosters. The value of this current is fixed by the current supplied by the current generator $I_{HV}$.

It is pointed out that, by causing the current amplifier 14 to operate in class AB, the advantage is achieved, that the behavior of the reading circuit according to the invention is rendered symmetrical in the sense that its performance during the stage of the charging of the capacitor 15 is substantially equivalent to its performance in the stage of the discharge thereof.

The initial biasing conditions of the capacitor 15 may advantageously be arranged in the center of the range within which the voltage of the gate terminal of the memory cell read will be regulated. Moreover, it will be noted that the input stage 54 including the transistors $M_4$ and $M_5$ connected in a common-gate arrangement, has a low input impedance which enables the advantages set out above in terms of stability and speed to be achieved.

The first current mirror 17 includes a PMOS transistor $M_6$ having a gate terminal connected to its own drain terminal and to the drain terminal of the transistor $M_4$ included in the input stage 54. The gate terminal of the transistor $M_6$ is also connected to a gate terminal of a PMOS transistor $M_8$ having a drain terminal connected to the output node 7.

The transistors $M_6$ and $M_8$ have respective source terminals connected to a terminal at which the voltage $V_{pp}$ is available. In operation, this first current mirror supplies at the drain terminal of the transistor $M_8$, a current equal to the current present at the drain terminal of the transistor $M_6$, multiplied by a suitable multiplication factor M.

The second current mirror 18 includes an NMOS transistor $M_7$ having a drain terminal connected to its own gate terminal and to the drain terminal of the transistor $M_5$ of the input stage 54. Moreover, the gate terminal of the transistor $M_7$ is connected to a gate terminal of a NMOS transistor $M_9$ having a drain terminal connected to the output node 7. The transistors $M_7$ and $M_9$ have respective source terminals connected to ground. In operation, this second current mirror 18 supplies, at the drain terminal of the transistor $M_9$, a current equal to the current present at the drain terminal of the transistor $M_7$, multiplied by a suitable multiplication factor which, for the purposes of symmetry of the reading circuit, is preferably equal to the multiplication factor of the first current mirror.

It is pointed out that the output impedance of the amplifier 14, that is, the impedance seen by the output node 7, is given by the impedance seen at the drains of the transistors $M_8$ and $M_9$, each of which is connected in a common-source arrangement and hence is such as to have a high impedance. As stressed above, by a suitable selection of the output impedance of the transistors $M_8$ and $M_9$ and of the capacitance $C_L$ of the capacitor 15, it is possible to achieve a transfer function of the reading circuit of FIG. 2 having substantially a single pole.

With reference to the operation of the amplifier 14, it is pointed out that, when the current $I_e$ present in the branch 13 increases relative to an equilibrium value, an increase takes place in the current which passes through the PMOS transistor $M_5$ in the input stage 54 and which enters the transistor $M_7$ of the second current mirror 18. The second current mirror 18 will have an increasing current in the direction into the drain terminal of the transistor $M_9$ and such as suitably to discharge the capacitor 15 through the node 7.

When the current $I_e$ present in the branch 13 decreases relative to an equilibrium value, an increase takes place in the current which passes through the NMOS transistor $M_4$ in the input stage 54 and which leaves the drain terminal of the transistor $M_6$ included in the first current mirror 17. The first current mirror 17 will have an increasing current in the direction out of the drain terminal of the transistor $M_8$ and such as suitably to charge the capacitor 15 through the node 7.

The insertion of a circuit embodiment of the feedback circuit 100 in a reading circuit has demonstrated the advantages offered by the present invention. With the reading circuit described above, it is possible to achieve reading times considerably shorter than those achieved by the circuits formed in accordance with the prior art. In fact, to reach the gate-control voltage with a deviation of less than 5 mV from the steady-state value, the circuit according to the invention took a time of less than 250 ns and, in particular, less than 120 ns. Moreover, a current absorption by the positive voltage-boosters of less than 20 $\mu$A during static operation, and a dynamic current absorption of about 200 $\mu$A for a period of about 50 ns, were observed.

High performance in terms of accuracy, stability, reading times, consumption and overall size which can be achieved by the reading circuit according to the invention are particularly advantageous for multilevel memories. This enables the multilevel approach to be used even with a number of levels greater than eight, unlike conventional reading circuits. The use of multilevel memories with large storage capacities is particularly advantageous in the field of portable devices such as, for example, mobile telephones, electronic diaries, Walkmans™, cameras and digital video cameras.

What is claimed is:

1. A reading circuit for reading a non-volatile memory cell having an output terminal for providing an output current and a control terminal for receiving a control voltage for controlling the output current, the reading circuit comprising:

a feedback circuit connected to the output terminal and to the control terminal for generating the control voltage from a reference signal and from the output current, said feedback circuit comprising a current amplifier having a first terminal for receiving a current-error signal derived from the reference signal and from the output current, and a second terminal for supplying an amplified current to generate the control voltage.

2. A reading circuit according to claim 1, wherein said feedback circuit further comprises:
   a current generator for generating the reference signal; and
   a comparison node between said current generator and the output terminal of the memory cell, the comparison node supplies to the first terminal of said current amplifier the current-error signal derived from a difference between the reference signal and a first current correlated with the output current.

3. A reading circuit according to claim 1, wherein a phase of the amplified current is opposite a phase of the current-error signal.

4. A reading circuit according to claim 1, wherein said current amplifier comprises an input stage having a low value input impedance so that a non-dominant pole is associated with said input stage.

5. A reading circuit according to claim 1, wherein said current amplifier comprises an output stage having a high value output impedance so that a transfer function of the reading circuit has a dominant pole associated with said output stage.

6. A reading circuit according to claim 1, wherein the second terminal is operatively connected to the control terminal of the memory cell, and wherein said feedback circuit further comprises a capacitive compensation element connected to the second terminal and being charged by the amplified current for generating the control voltage.

7. A reading circuit according to claim 2, further comprising a current mirror between the comparison node and the output terminal for generating the first current from the output current.

8. A reading circuit according to claim 1, wherein said current generator and said current mirror are supplied with a first supply voltage, and said current amplifier is supplied with a second voltage greater than the first supply voltage.

9. A reading circuit according to claim 1, wherein said current amplifier is configured as a class AB current amplifier.

10. A reading circuit according to claim 4, wherein said input stage comprises a first input transistor and a second input transistor connected to said first input transistor, each of said first and second input transistors having a respective source terminal connected to the first terminal, and being biased in a common-gate arrangement.

11. A reading circuit according to claim 5, wherein said output stage comprises a first current mirror and a second current mirror connected to the second terminal for multiplying a current supplied by said input stage by a multiplication factor, and for supplying the amplified current to the second terminal.

12. A reading circuit according to claim 1, wherein said first and second current mirrors each comprises respective output transistors connected to the second terminal, and said first and second output transistors being biased in a common-source arrangement.

13. A reading circuit for reading a plurality of memory cells arranged in rows and columns, each memory cell having an output terminal for providing an output current and a control terminal for receiving a control voltage for controlling the output current, the reading circuit comprising:
   a feedback circuit connected to the output terminal and to the control terminal of a selected memory cell for generating the control voltage from a reference signal and from the output current, said feedback circuit comprising
      a current generator for generating the reference signal,
      a current amplifier having a first terminal for receiving a current-error signal derived from the reference signal and from the output current, and a second terminal for supplying an amplified current to generate the control voltage,
      a comparison node between said current generator and the output terminal of the selected memory cell, the comparison node supplies to the first terminal the current-error signal derived from a difference between the reference signal and a first current, and
      a current mirror between the comparison node and the output terminal of the selected memory cell for generating the first current correlated with the output current.

14. A reading circuit according to claim 13, wherein the second terminal is operatively connected to the control terminal of the selected memory cell, said feedback circuit further comprising a capacitive compensation element connected to the second terminal and being charged by the amplified current for generating the control voltage.

15. A reading circuit according to claim 13, wherein said current generator and said current mirror are supplied with a first supply voltage, and said current amplifier is supplied with a second voltage greater than the first supply voltage.

16. A reading circuit according to claim 13, wherein said current amplifier comprises an input stage comprising a first input transistor and a second input transistor connected said first input transistor, each of said first and second input transistors having a respective source terminal connected to the first terminal, and being biased in a common-gate arrangement.

17. A reading circuit according to claim 13, wherein said current amplifier comprises an output stage comprising a first current mirror and a second current mirror connected to the second terminal for multiplying a current supplied by said input stage by a multiplication factor, and for supplying the amplified current to the second terminal.

18. A reading circuit according to claim 17, wherein said first and second current mirrors each comprises respective output transistors connected to the second terminal, and said first and second output transistors being biased in a common-source arrangement.

19. An integrated circuit comprising:
   a plurality of non-volatile memory cells arranged in rows and columns, each memory cell having an output terminal for providing an output current and a control terminal for receiving a control voltage for controlling the output current; and
   a reading circuit connected to said plurality of memory cells and comprising
      a feedback circuit connected to the output terminal and to the control terminal of a selected memory cell for generating the control voltage from a reference signal and from the output current,
      said feedback circuit comprising a current amplifier having a first terminal for receiving a current-error signal derived from the reference signal and from the output current, and a second terminal for supplying an amplified current to generate the control voltage.

20. An integrated circuit according to claim 19, wherein said feedback circuit further comprises:
   a current generator for generating the reference signal; and
   a comparison node between said current generator and the output terminal of the selected memory cell, the comparison node supplies to the first terminal of said current amplifier the current-error signal derived from a difference between the reference signal and a first current correlated with the output current.

21. An integrated circuit according to claim 19, wherein the second terminal is operatively connected to the control terminal of the selected memory cell, the feedback circuit further comprising a capacitive compensation element connected to the second terminal and being charged by the amplified current for generating the control voltage.

22. An integrated circuit according to claim 20, wherein said feedback circuit further comprises a current mirror between the comparison node and the output terminal for generating the first current from the output current.

23. An integrated circuit according to claim 19, wherein said current amplifier comprises an input stage comprising a first input transistor and a second input transistor connected to the first input transistor, each of said first and second input transistors having a respective source terminal connected to the first terminal, and being biased in a common-gate arrangement.

24. An integrated circuit according to claim 19, wherein said current amplifier comprises an output stage comprising a first current mirror and a second current mirror connected to the second terminal for multiplying a current supplied by the input stage by a multiplication factor, and for supplying the amplified current to the second terminal.

25. An integrated circuit according to claim 19, further comprising a voltage limiting circuit connected to the output terminal of the selected memory cell for keeping a voltage of the output terminal substantially constant.

26. An integrated circuit according to claim 19, further comprising an analog-digital converter connected to the control terminal of the selected memory cell for converting the control voltage into a digital word correlated with a threshold voltage programmed in the selected memory cell.

27. An integrated circuit according to claim 19, further comprising a line decoder and a column decoder operatively associated with said plurality of memory cells for selecting a memory cell based upon a corresponding address signal.

28. An integrated circuit according to claim 19, wherein each memory cell is a multilevel memory cell being programmable to one of a plurality of programming levels.

29. A method for reading a memory cell having an output terminal for providing an output current and a control terminal for receiving a control voltage for controlling the output current, the method comprising:

generating the control voltage from a reference signal and from the output current using a feedback circuit connected to the output terminal and to the control terminal, the feedback circuit comprising a current amplifier having a first terminal for receiving a current-error signal derived from the reference signal and from the output current, and a second terminal for supplying an amplified current.

30. A method according to claim 29, further comprising:

generating the reference signal; and supplying to the first terminal of the current amplifier the current-error signal derived from a difference between the reference signal and a first current correlated with the output current.

31. A method according to claim 29, wherein the second terminal is operatively connected to the control terminal of the memory cell, the method further comprising charging a capacitive compensation element connected to the second terminal using the amplified current for generating the control voltage.

32. A method according to claim 30, further comprising a current mirror between a comparison node and the output terminal for generating the first current from the output current.

33. A method according to claim 29, wherein the current amplifier comprises an input stage comprising a first input transistor and a second input transistor connected to the first input transistor, each of the first and second input transistors having a respective source terminal connected to the first terminal, and the method further comprising biasing the respective source terminals connected to the first terminal.

34. A method according to claim 29, wherein the current amplifier comprises an output stage comprising a first current mirror and a second current mirror connected to the second terminal for multiplying a current supplied by the input stage by a multiplication factor, and for supplying the amplified current to the second terminal.

35. A method according to claim 29, wherein the output terminal of the memory cell is connected to a voltage limiting circuit for keeping the voltage of the output terminal substantially constant.

36. A method according to claim 29, wherein the control terminal of the memory cell is connected to an analog-digital converter for converting the control voltage into a digital word correlated with a threshold voltage programmed in the memory cell.

* * * * *

UNITED STATES PATENT AND TRADEMARK OFFICE
CERTIFICATE OF CORRECTION

PATENT NO. : 6,480,421 B2
DATED : November 12, 2002
INVENTOR(S) : Khouri Osama et al.

It is certified that error appears in the above-identified patent and that said Letters Patent is hereby corrected as shown below:

Title page,
Insert Item -- [30] Foreign Application Priority Data
October 27, 2000 (IT)..........MI2000A002337 --

Column 3,
Line 48, delete "reference" insert -- a reference --
Line 48, delete "$_{REF}$" insert -- $I_{REF}$ --

Column 4,
Line 50, delete "$V_{GR} = V_{TH} + V_0V$" insert -- $V_{GR} = V_{TH} + V_{0V}$ --

Column 6,
Line 3, delete "sated" insert -- stated --

Column 10,
Line 27, delete "connected said" insert -- connected to said --

Signed and Sealed this

Twenty-second Day of July, 2003

JAMES E. ROGAN
*Director of the United States Patent and Trademark Office*